US010970239B2

(12) United States Patent
Bhaskar et al.

(10) Patent No.: US 10,970,239 B2
(45) Date of Patent: Apr. 6, 2021

(54) HUB CIRCUIT FOR A DIMM HAVING MULTIPLE COMPONENTS THAT COMMUNICATE WITH A HOST

(71) Applicant: Intel Corporation, Santa Clara, CA (US)

(72) Inventors: Rajesh Bhaskar, Bangalore (IN); Kenneth Foust, Beaverton, OR (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 15/970,639

(22) Filed: May 3, 2018

(65) Prior Publication Data
US 2019/0042497 A1 Feb. 7, 2019

(51) Int. Cl.
*G11C 7/10* (2006.01)
*G06F 13/16* (2006.01)
*G06F 13/40* (2006.01)
*G11C 5/02* (2006.01)
*G06F 13/42* (2006.01)
*G06F 1/18* (2006.01)
(Continued)

(52) U.S. Cl.
CPC .......... *G06F 13/1684* (2013.01); *G06F 1/185* (2013.01); *G06F 13/409* (2013.01); *G06F 13/4234* (2013.01); *G11C 5/02* (2013.01); *G11C 7/1003* (2013.01); *G11C 5/04* (2013.01); *G11C 7/22* (2013.01)

(58) Field of Classification Search
CPC .............. G06F 13/1684; G06F 13/409; G06F 13/4234; G06F 1/185; G11C 5/02; G11C 7/22; G11C 7/1003; G11C 5/04
See application file for complete search history.

(56) References Cited

U.S. PATENT DOCUMENTS

2005/0188105 A1* 8/2005 Reinhard ............ H04L 12/4633
709/238
2007/0286078 A1* 12/2007 Coteus ................ G06F 13/1657
370/235
(Continued)

OTHER PUBLICATIONS

Foust, Ken, "A Developer's Guide to MIPI 13CSM for Sensors and Beyond", mipi.org/devcon, MIPI Alliance Developers Conference, Bangalore, India, 2017, 18 pages.
(Continued)

*Primary Examiner* — Idriss N Alrobaye
*Assistant Examiner* — Ronald T Modo
(74) *Attorney, Agent, or Firm* — Compass IP Law PC (57) ABSTRACT

An apparatus is described. The apparatus includes a DIMM hub circuit. The DIMM hub circuit includes first bus interface circuitry, control circuitry and second bus interface circuitry. The first bus interface circuitry is to receive header information and payload information from a host. The control circuitry is to process the header information and recognize that the payload is to be passed to a target component that is coupled to the DIMM hub circuit through a second bus that is a same type of bus as the first bus. The second bus interface circuitry to send the payload information over the second bus to the target component, wherein, the payload information is to include embedded header information to be processed by the target component.

20 Claims, 13 Drawing Sheets

(51) Int. Cl.
  *G11C 7/22* (2006.01)
  *G11C 5/04* (2006.01)

(56) References Cited

U.S. PATENT DOCUMENTS

| | | | |
|---|---|---|---|
| 2010/0005214 A1* | 1/2010 | Trombley | G06F 13/405 |
| | | | 710/310 |
| 2012/0166582 A1* | 6/2012 | Binder | H04L 63/18 |
| | | | 709/217 |
| 2017/0255588 A1* | 9/2017 | Pitigoi-Aron | G06F 13/364 |
| 2018/0321845 A1* | 11/2018 | Mutnury | H04L 25/03076 |

OTHER PUBLICATIONS

Joehren, Michael., "MIPI I3C Technology an Introduction to MIPI I3C", AMF-DES-T2686, NXP, Jun. 2017, 42 pages.

\* cited by examiner

Error Message From Selected Hub to Host

Fig. 9

Read Command

Fig. 10

Read Response on Host Bus

Fig. 11

HUB CIRCUIT FOR A DIMM HAVING MULTIPLE COMPONENTS THAT COMMUNICATE WITH A HOST

CROSS REFERENCE TO RELATED APPLICATION

This application claims, under 35 U.S.C. 119, the benefit of India Provisional Patent Application No. 201841/009,712, filed in the India Patent Office on Mar. 16, 2018, entitled "A HUB CIRCUIT FOR A DIMM HAVING MULTIPLE COMPONENTS THAT COMMUNICATE WITH A HOST" and which is hereby incorporated by reference in its entirety into this application.

FIELD OF INVENTION

The field of invention pertains generally to the computing sciences, and, more specifically, to a hub circuit for a DIMM having multiple components that communicate with a host.

BACKGROUND

System memory designers are often looking for new ways to improve the performance and/or functionality of their design. Unfortunately, increased performance/functionality generally comes at the expense of more components/devices that need to be communicated to, and, the more components/devices that need to be communicated to, the slower the throughput of the overall design. As such, creative architectures are needed in order to achieve improved performance and/or functionality without loss of throughput.

FIGURES

A better understanding of the present invention can be obtained from the following detailed description in conjunction with the following drawings, in which.

DETAILED DESCRIPTION

Figure 1:
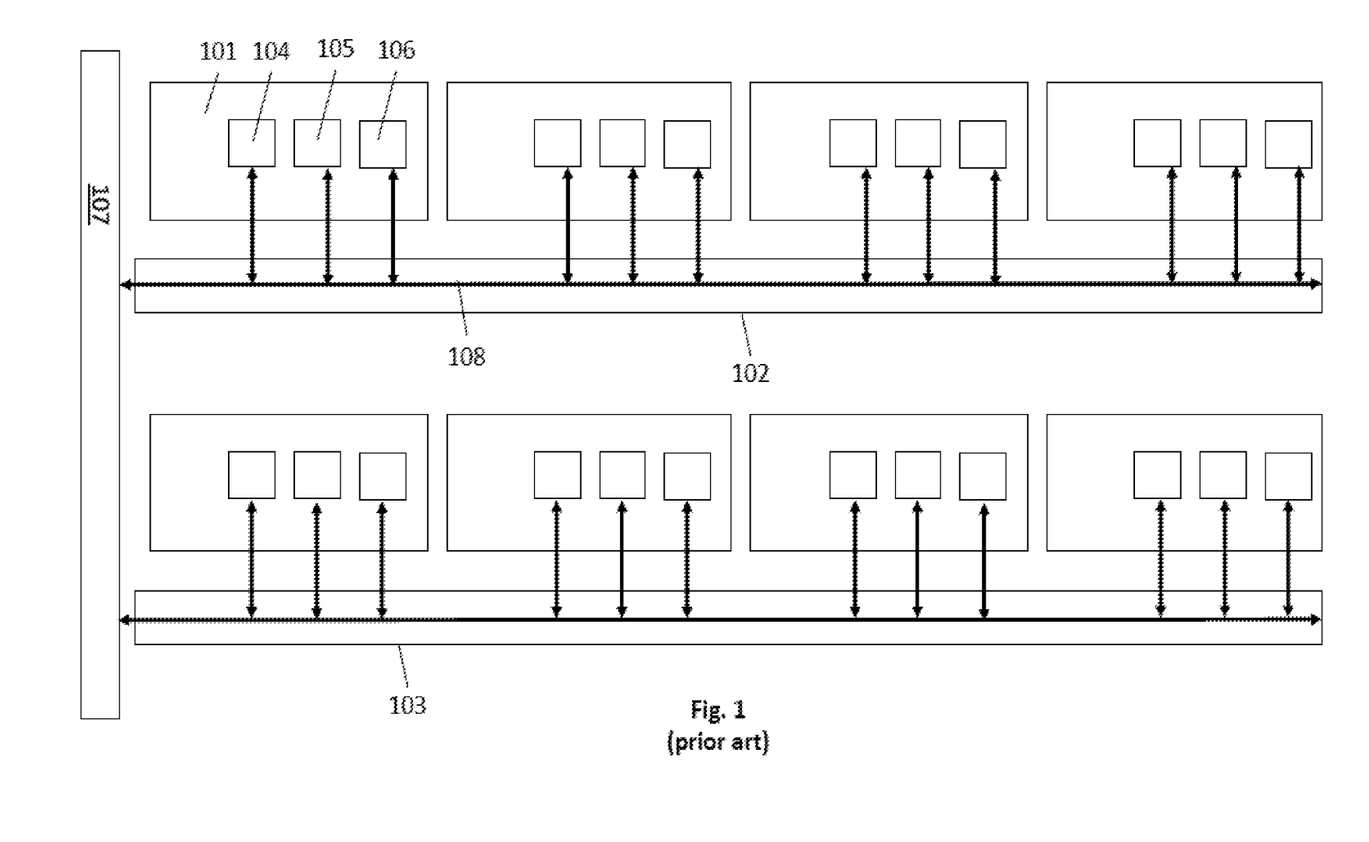
FIG. 1 shows a traditional MIPI bus system memory implementation.

FIG. 1 shows a traditional arrangement of dual in-line memory modules (DIMMs) 101 plugged into respective memory channels 102, 103. Here, each of two memory channels 102, 103 are observed to have four different DIMMs 101 respectively plugged into them. As observed, each DIMM includes additional components other than memory chips. That is, each DIMM also includes an electrically erasable programmable read only memory (EEPROM) 104, temperature sensor 105, a power management integrated circuit 106 among other possible components. A first high speed industry standard data bus that is integrated into the memory channels 102, 103 is used to write/read information to/from the DIMM memory devices. For example, the high speed data bus may conform to a joint electron device engineering council (JEDEC) compliant dual data rate (DDR) bus specification. For ease of drawing this data bus is not depicted in FIG. 1.

A second industry standard data bus 108 used to support communications between the host 107 and the other DIMM components 104, 105, 106 is also integrated into each of the memory channels 102, 103. Here, the host may be a processor of a computer that includes multiple general purpose processing cores and a system memory controller (also referred to as a main memory controller). This bus 108 may conform to a Mobile Industry Processor Interface (MIPI) I3C standard. A problem is that higher bandwidths are generally desired for the MIPI I3C bus 108 but the parallelization of multiple DIMMs each having multiple components being plugged into the bus 108 in a multi-drop bus fashion as depicted in FIG. 1 increases the capacitive loading on the MIPI I3C bus 108. As is known in the art, capacitive loading acts to increase the capacitance on any/all of the bus wires which, in turn, makes it difficult to send high speed signals over the bus's wires.

Figure 2:
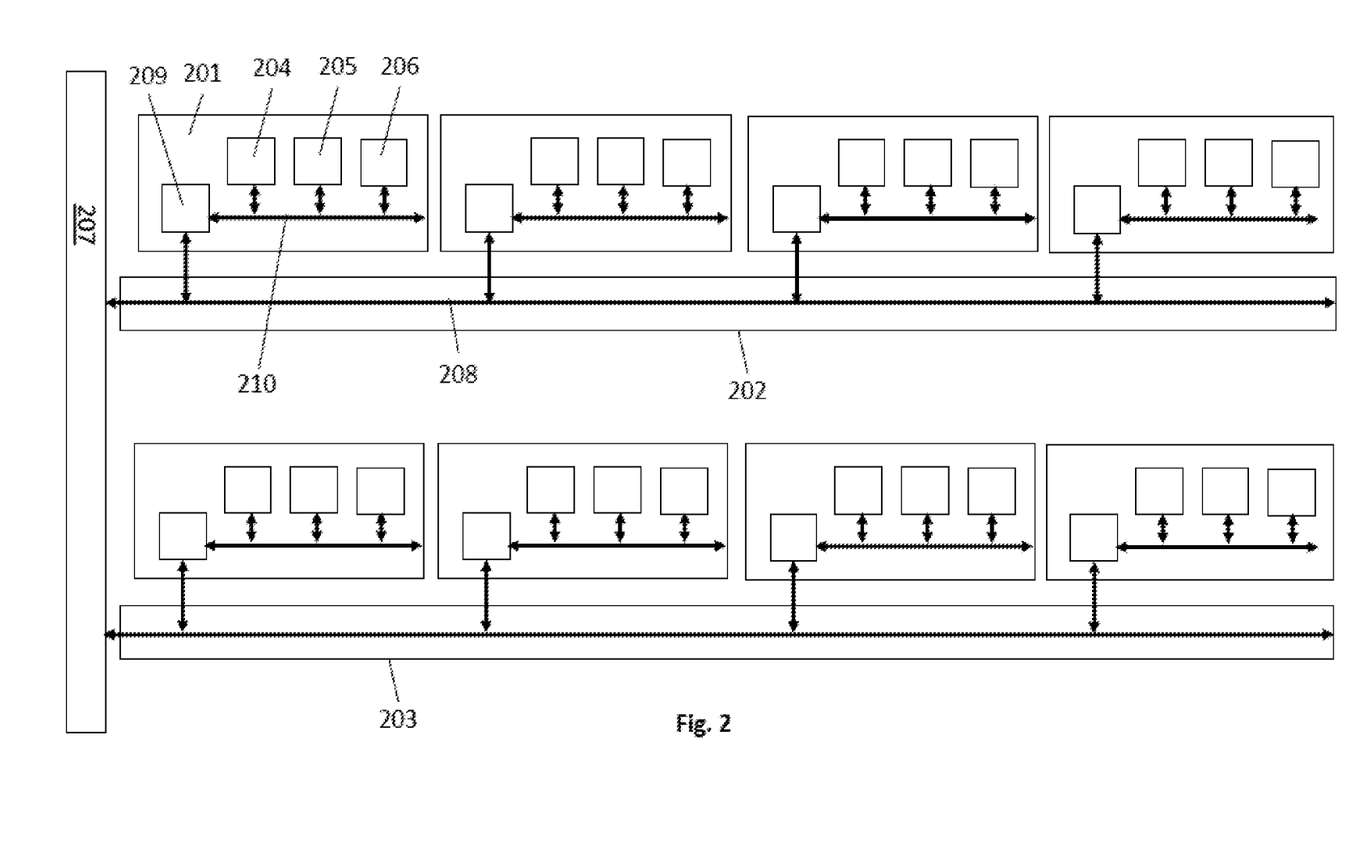
FIG. 2 shows an improved MIPI bus system memory implementation.

A potential solution, depicted in FIG. 2, is to impose a hub circuit 209 on each DIMM to reduce the loading on the MIPI I3C bus 208 that resides between the host 207 and the DIMMs 201. Here, in various embodiments, the hub 209 ensures that the host 207 sees a load that is significantly less than the load of all components of all the DIMMs. Here, the presence of a hub 209 on each DIMM essentially breaks the MIPI I3C bus into multiple pieces: 1) a "host side" piece 208 that includes the wiring between the host 207 and the respective hub 209 on each of the DIMMs; and, 2) one "local bus" 210 on each DIMM that couples the "back side" of the hub 207 to the components 204, 205, 206 on the hub's DIMM that are to communicate with the host 207 over the MIPI I3C bus.

In the case of a communication from the host 207 to a particular one of the components on a particular one of the DIMMs, each of the hubs on the DIMMs that are not targeted by the host are placed into a high impedance state, and the hub on the DIMM having the component that is being targeted by the host 207 acts as a gateway that passes the communication from the host 207 to the targeted DIMM's local bus 210.

Figure 3:
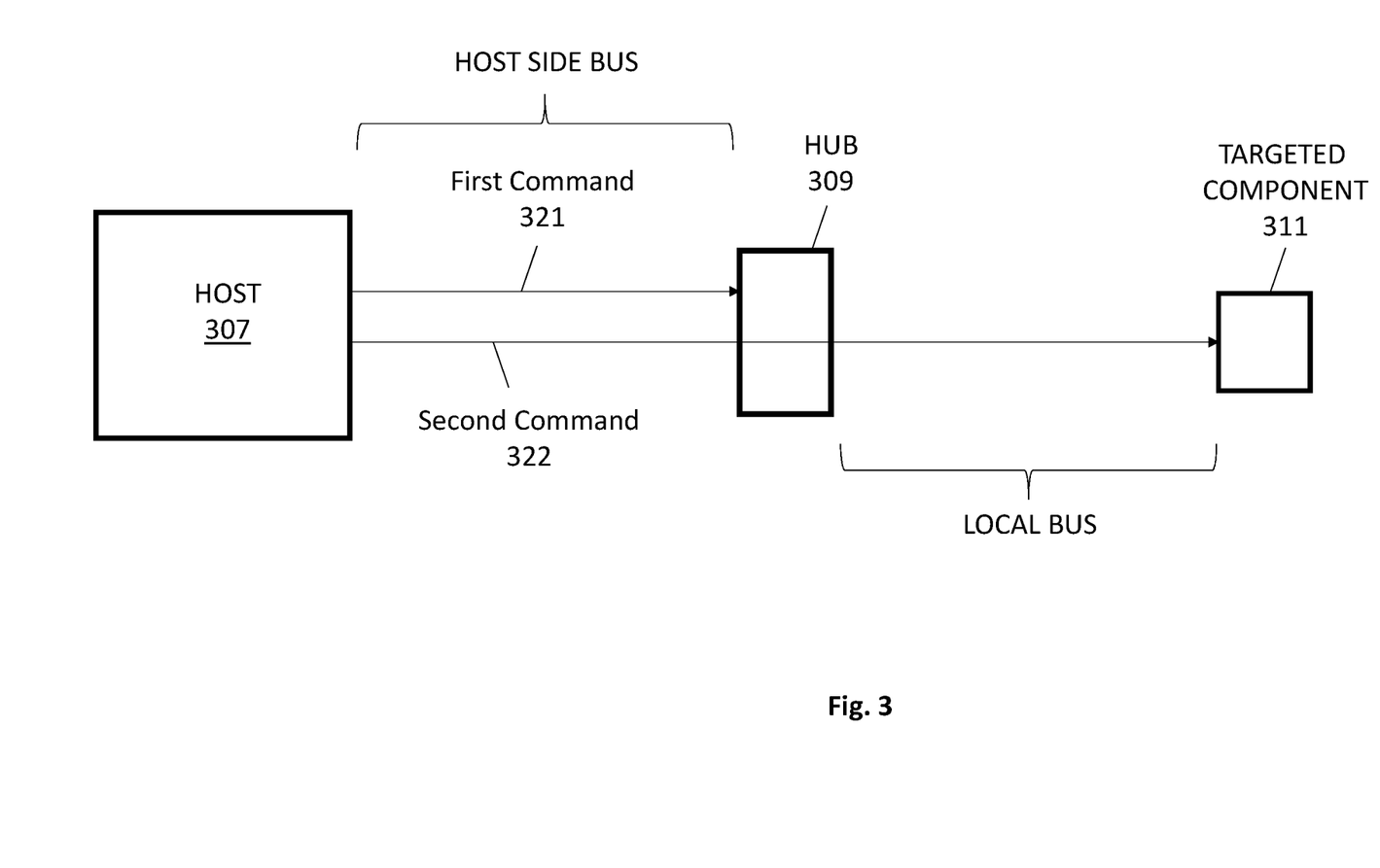
FIG. 3 shows a communication approach for the improved MIPI bus system memory implementation of FIG. 2.

According to a first variant of this approach, depicted in FIG. 3, two commands 321, 322 are sent from the host 307 in order to effect communication from the host 307 to a particular target 311 on a particular DIMM. The first command 321 is sent from the host 307 to the DIMM's hub 309 to "select" the hub 309. The second command 322 is sent from the host 307, through the hub 309, to the target 311 over the DIMM's local bus (thus the second command passes over both the host-side bus and the targeted local bus). In the case of the second command 322, the hub 309 essentially behaves as a closed electrical switch that re-drives the host's signals onto the targeted local bus. The second command 322, therefore, is the actual command from the host 307 to the component 311 that necessitated the back-to-back command sequence.

A problem with this approach, however, is the time consumed executing two separate commands 321, 322 to effect only a single communication from host 307 to target component 311 combined with the resulting bus confusion that can result even if the components that are coupled to the bus behave in conformance with bus protocol specifications.

Figure 4:
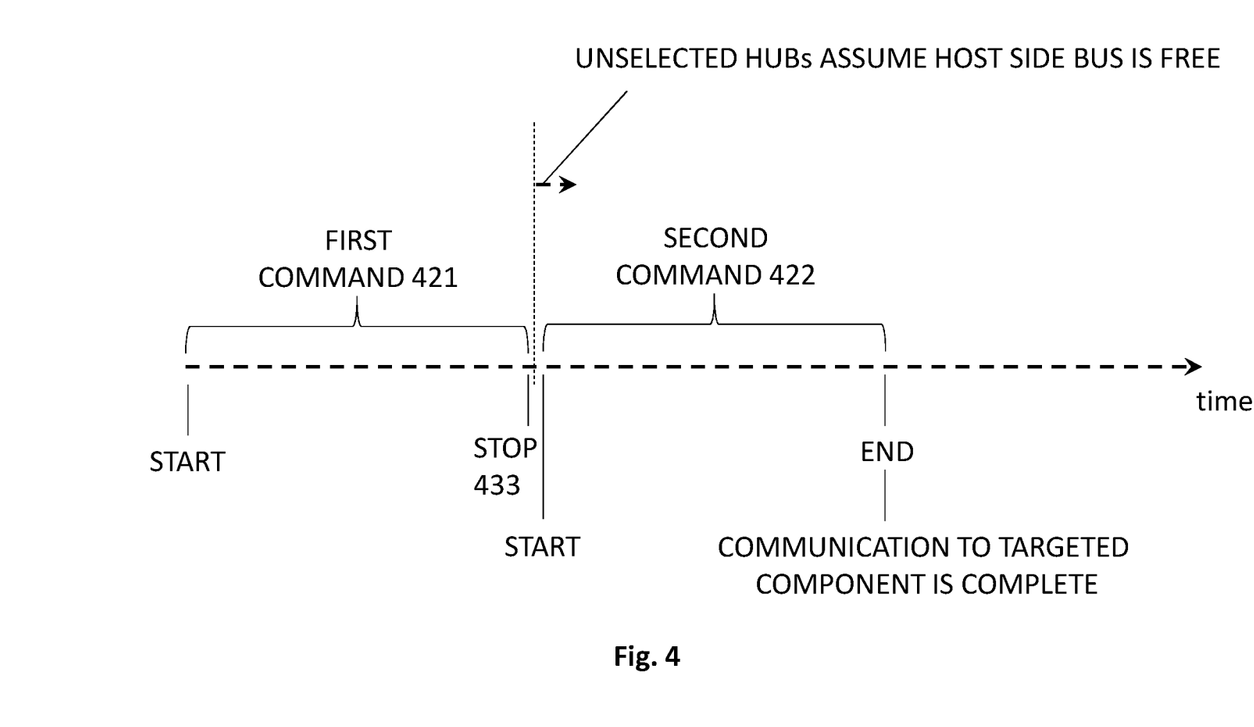
FIG. 4 shows an improved communication approach for the improved MIPI bus system memory implementation.

FIG. 4 depicts the problem is some detail. As depicted in FIGS. 3 and 4, the first command 321, 421 from the host 307 to the hub 309 starts with a START condition and ends with an STOP condition that is broadcast on the host side part of the bus to the selected hub 309. The second command 322, 422 from the host 307 to the targeted component 311 also begins with an immediately following START condition and STOP condition that is broadcast on both the host side bus and the local bus of the targeted DIMM. Here, as is understood in the art, the substantive part of a communication is inserted between START and STOP conditions.

For example, between the first START and STOP conditions of the first command 321, 421, a message is sent from the host 307 to the hub 309 informing the hub 309 that it has been selected (and informing the other hubs on the host side bus that they are not selected). Between the START and STOP conditions of the second command 322, 422, the communication between the host 307 and targeted component 311 that necessitated the entire sequence is passed from the host 307 to the component 311 (e.g., a read command, write command, etc.). As can be seen in FIG. 4, however, the pair of commands 421, 422 approximately doubles the communication overhead as compared to a nominal MIPI I3C bus that does not include the hub architecture (and only a single command is needed to complete communication from the host to any component). Thus, even if the introduction of the hub architecture permits a doubling of the clock frequency that can be applied to the bus, the increased speed is wasted with additional communication overhead.

Apart from the added overhead inefficiency, the formal MIPI I3C protocol permits components that are coupled to a MIPI I3C bus to interpret the generation of an STOP condition as meaning that overall communication has been successfully completed. As such, after an STOP condition has been placed on the bus, the bus is deemed "free" (e.g., idle, available) which permits other components to initiate communications over the bus.

Unfortunately, in the case of the communication approach of FIG. 4, the overall communication is not deemed complete until well after the first STOP condition 433. Thus, conceivably, other agents that are coupled to the host side bus, such as any of the hubs other than the unselected hub 309 may try to initiate communication on the host side bus in a way that conflicts with or at least delays transmission of the second command 321, 421. For example another hub may initiate communication over the host side bus immediately after the first STOP condition 433 which may disrupt or delay the second command 422.

Figure 5:
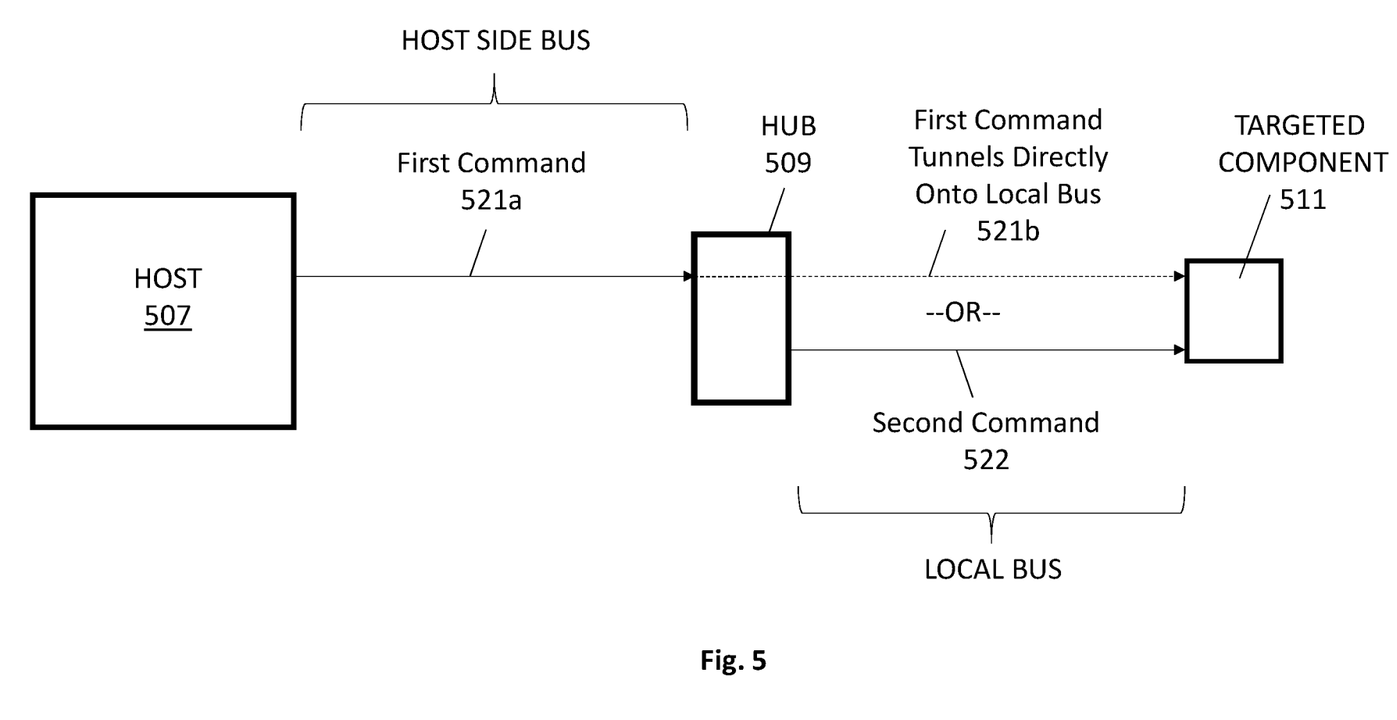
FIG. 5 shows another perspective of the improved communication approach of FIG. 4.
Figure 6A:
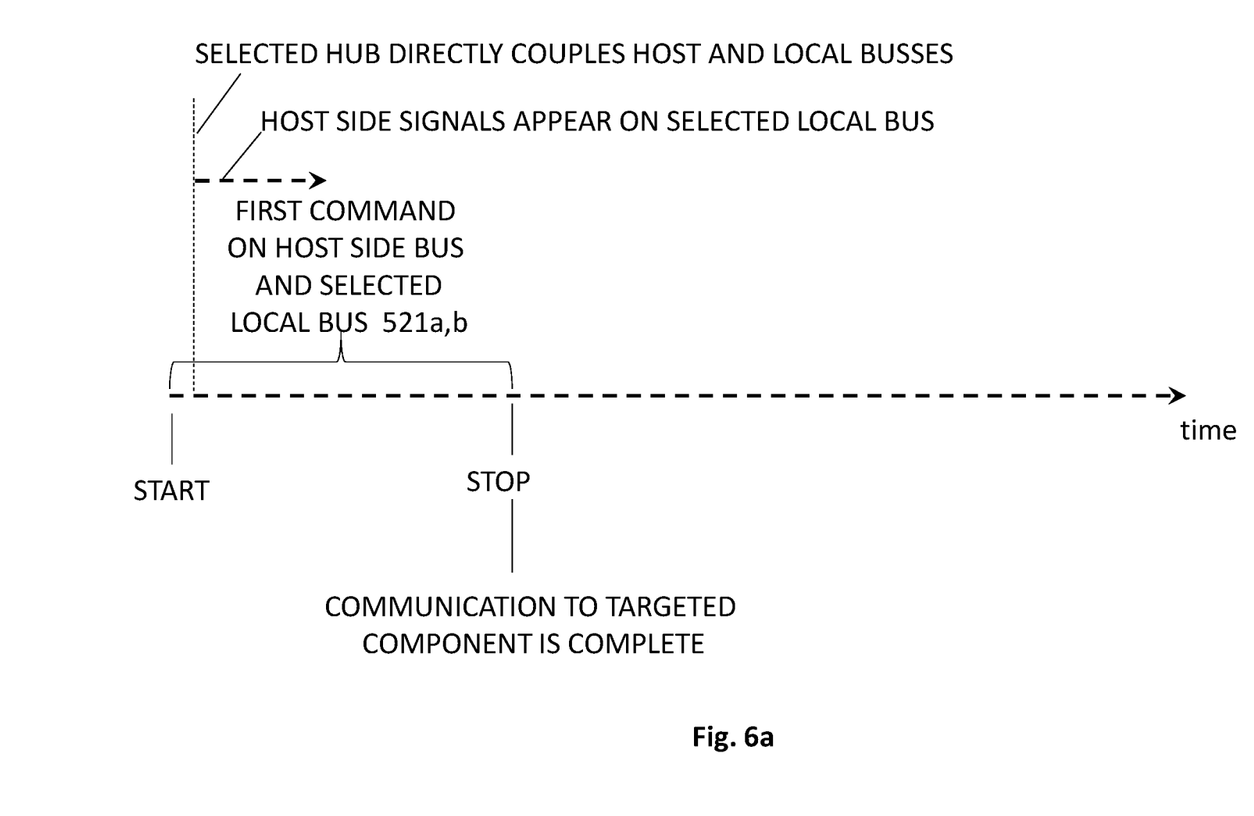
FIG. 6a shows a first embodiment for the improved communication approach of FIG. 4.
Figure 6B:
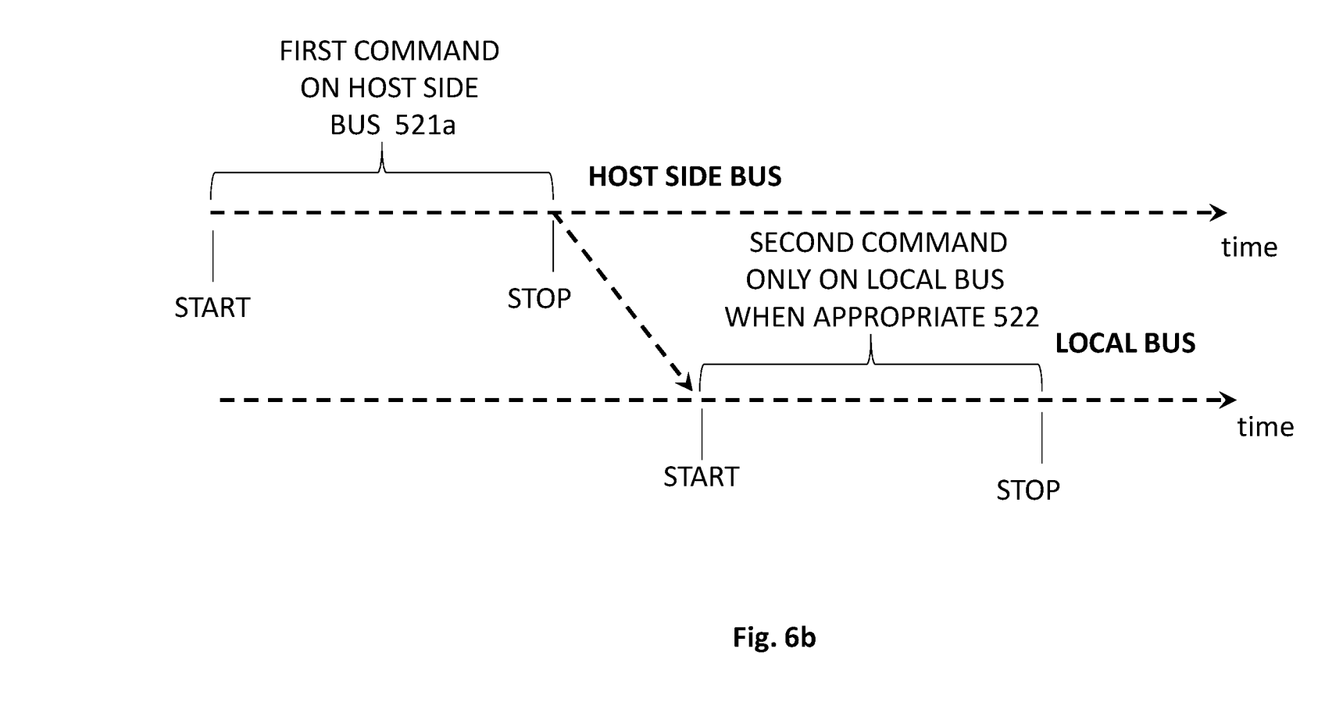
FIG. 6b shows a second embodiment for the improved communication approach of FIG. 4.

FIGS. 5, 6a and 6b pertain to an improved hub based communication approach in which, rather than impose a second full command 322, 422 over the host side bus, instead, only a single command 521a from the host 507 to the hub 509 is required over the host side bus to complete communication from the host 507 to the targeted component 511.

Here, the hub 509: 1) as referenced by communication 521b in FIG. 5 and FIG. 6a, couples the host side bus and targeted local bus immediately after the START condition of the host to hub command 521a that transpires on the host side bus (which enables direct communication from host 507 to targeted component 511 during the first command 521); or, 2) as referenced by communication 522 in FIG. 5 and FIG. 6b, internally stores the contents of the initial command 521a from the host 507 to the hub 509 and then forwards these contents to the targeted component 511 by way of an isolated, second command 522 that transpires only between the hub 509 and targeted component 511 over the local bus.

In the case of the latter, as far as the host side part of the bus is concerned, the communication is complete after the first communication 521a from the host to the hub, which, in turn, permits other devices to attempt to use the host side part of the bus immediately after the STOP condition of the first communication 521a. The hub 509 subsequently forwards the contents of the initial command 521a to the targeted component at its leisure and in isolation from the host side part of the bus.

Thus, regardless as to which approach is taken (FIG. 6a or FIG. 6b), after the first communication 531a from the host 507 to the selected hub 509 transpires, the host side part of the bus is indifferent as to when the second communication (521b or 522) is sent from the hub 507 to the targeted component 511 over the local bus. As such no confusion will exist on either the host or local busses. Additionally, the host side bus is free after the first command 521a which largely eliminates the overhead inefficiency associated with the solution of FIGS. 3 and 4.

According to the first approach 521b (and FIG. 6a) in which the hub 509 essentially behaves as a form of short circuit between the host side bus and the targeted local bus during the transmission of the first command 521, note that the targeted hub 509 switches into direct coupling (or short circuit) mode shortly after the sending of the START condition of the first command 521a.

Figure 7:
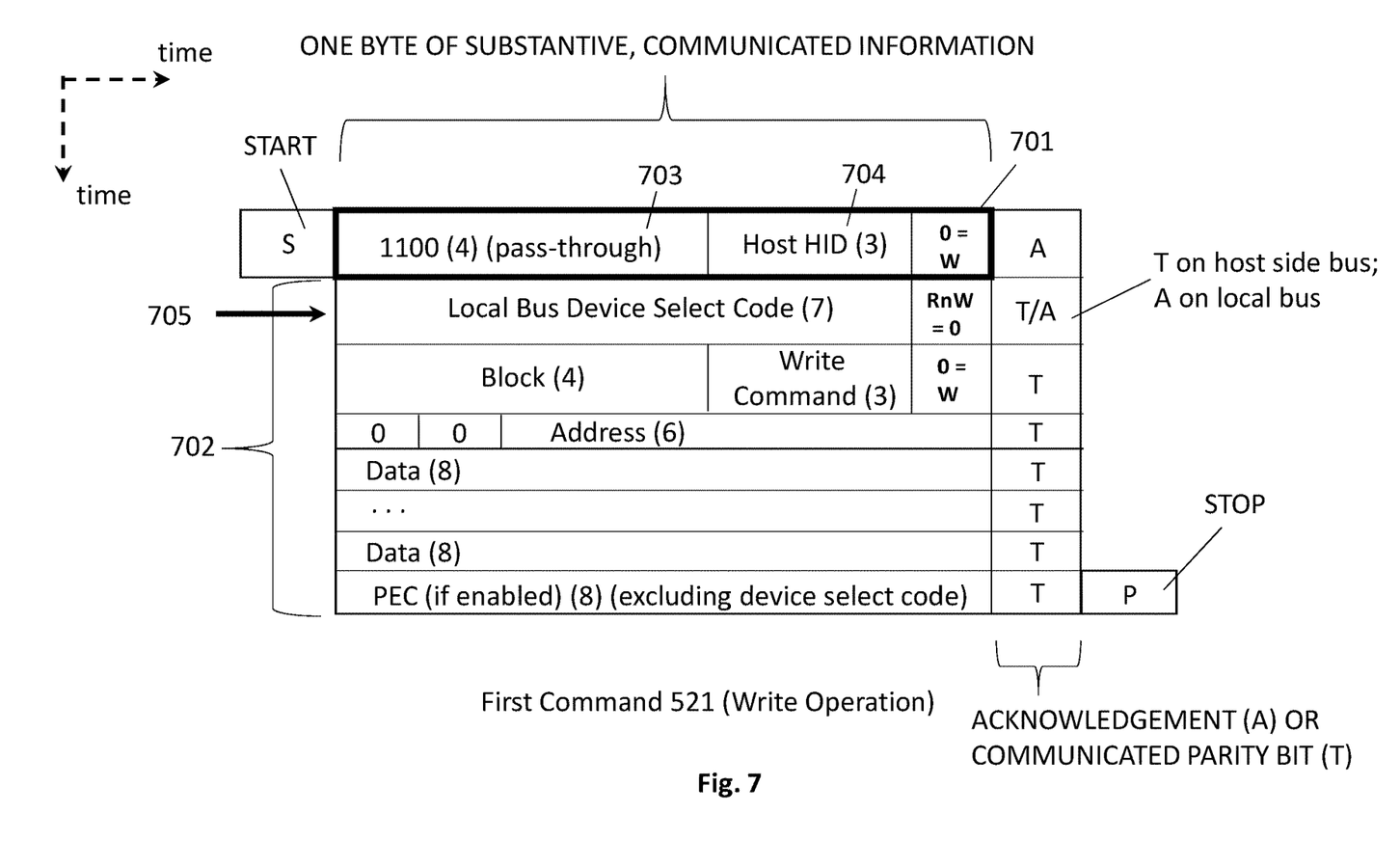
FIG. 7 shows an embodiment of a write command.

More specifically, referring to FIG. 7, which shows the first command 521a in more detail for a write command, note that the first byte 701 after the START condition can be viewed as the header of a larger, overall communication packet where the header 701 is one byte of information and the payload consists of a following number of bytes of information 702. For ease of illustration, FIG. 7 aligns the bit locations of each byte of the communication such that time is increasing both from left to right and from top to bottom.

Here, the header 701 includes a special code in its leading few (e.g., four) bits 703 ("1100") that immediately signifies that the communication is being directed to a component on a local bus. Immediately after the special code 703, another three bits 704 identifies the selected hub from amongst the other hubs on the host side bus. Here, with the MIPI I3C specification specifying the header as including 7 bits of address, the first four bits 703 signify the special code and the remaining three bits 704 are used for the identification of the selected hub.

Thus, immediately after the first byte 701 is passed over the host side bus, the selected hub understands that the host has initiated a communication to one of its (the selected hub's) components and the other unselected hubs understand that the present communication on the host side bus is not being directed to them. As such, immediately after the propagation of the first byte 701 on the host side bus, the selected hub can either immediately switch to "short circuit" mode (FIG. 6a), or, decide it will process the message in a store and forward approach (FIG. 6b). The unselected hubs will also immediately switch to a high impedance state.

Assuming the selected hub decides to immediately switch to short circuit mode, the selected hub will effectively close a switch between its local bus and the host side bus. According to one approach, the closing of the switch should be complete by the beginning of the transmission of the first payload packet 705 which immediately follows the header packet 701. In an embodiment, the switch is closed while the selected hub is acknowledging the communication from the host between the end of the header byte 701 and the beginning of the first payload byte 705. In forming the closed switch, the selected hub couples its host side interface circuitry to its internal open drain (OD) and push-pull (PP) interface circuitry that interfaces to its local bus as a master. In so doing, the payload bytes 702 are directly re-driven onto the local bus. That is, the first byte 701 is not re-transmitted on the local bus. Rather, the first byte 705 of the payload 702 is the first byte to be re-transmitted on the local bus.

Notably, the first byte 705 of the payload 702 is essentially a second header byte that is to be processed by the components that are coupled to the local bus. As seen in FIG. 7, the first payload byte 705 identifies the targeted component on the local bus and includes a proper setting for the RnW bit for the particular communication that is being sent to the targeted component. Ideally, the targeted component acknowledges (A) the first payload byte 705 back to the selected hub on the local bus during the same time period over which the selected hub processes the parity bit (T) of the first payload byte 705 as received from the host. Thereafter, the remaining payload bytes that effect the complete communication from the host to the targeted component are sent by the host directly to the targeted component through the selected hub. Eventually a STOP condition is sent from the host to the targeted component which ends the communication. In response to observance of the STOP condition, the selected hub decouples the host and local busses from one another.

Notably, in the approach of FIG. 7, the unselected hubs will remain in a high impedance state over the course of the entire communication and will not attempt to communicate over the host side bus until the STOP condition is observed. That is, upon recognizing they are not selected for the communication they will refrain from issuing any communication on the host side bus until they observe the STOP condition. Thus, no conflicting communications are issued on the host side bus while the communication is on-going and the communication is allowed to complete without disturbance from an unselected hub.

In the store and forward approach of FIG. 6b, the same correspondence as described just above for FIG. 7 transpires between the host and selected hub. However, the selected hub queues/stores the communication from the host rather than immediately redriving it. After completion of the communication from the host to the selected hub, signified by the sending of the STOP condition, the unselected hubs are free to attempt to communicate over the host side bus. The selected hub subsequently replays the stored payload bytes 702 over the local bus at a later time that is deemed appropriate. In so-doing, the selected hub couples its local bus interface circuitry to its internal storage space so that the contents of the storage space (payload bytes 702) are transmitted over the local bus. Note that the replay may start anytime after the first payload byte 705 has been received and stored (e.g., conceivably, replay may start while the second payload byte that immediately follows the first payload byte 705 is being transmitted on the host side bus). However in many cases it may start after the STOP condition has been transmitted.

During replay, processing continues on the local bus as described above. Notably, no components on the local bus can attempt to utilize the local bus during the replay transmission on the local bus but can so attempt before or after the transmission. As such, notably, one reason why the selected hub may choose to store and forward a message from the host rather than immediately redrive it is that the local hub is busy (e.g., replay transmitting an earlier received store and forward message) when the host sends its message to the selected hub.

In the case of the write operation of FIG. 7, note that after the header information in the first byte 705 of the payload 702, the subsequent bytes of the payload 705: 1) identify communication as a write command ("Write Command"); 2) identify the addressing space in the targeted component where the write data is to be written ("Address"); and, 3) include the data to be written ("Data").

Figure 8:
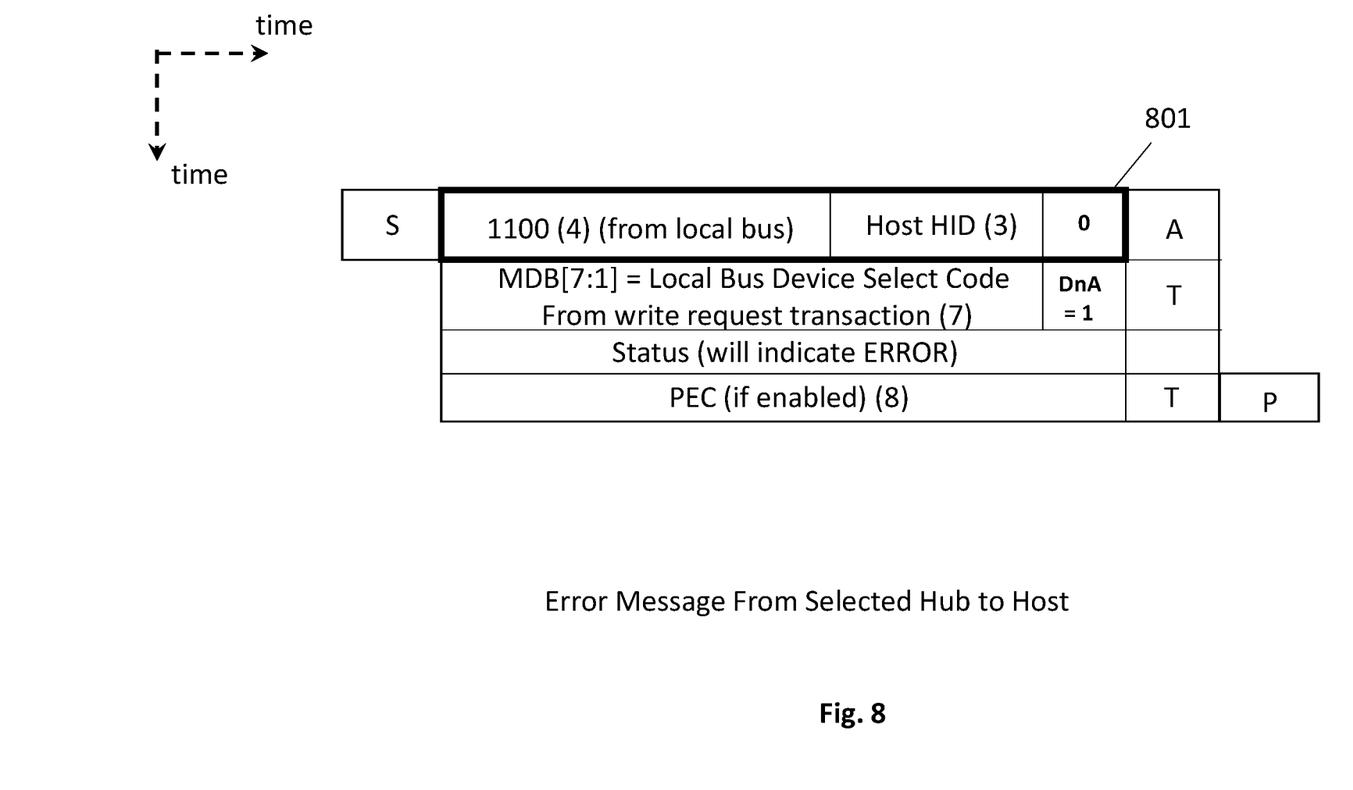
FIG. 8 shows an embodiment of an error command.

In an embodiment, no additional communication is sent to the host if the communication to the targeted component on the local bus is successful (again, from the host's perspective, the transmission is deemed complete after the first command 521a is sent from the host to the selected hub). In an embodiment, however, if a problem arises in the communication the selected hub will send a subsequent communication to the host to inform the host that the previous command failed. In a further embodiment, the report of the failed communication is sent as an In Band Interrupt (IBI) message on the host side bus from the selected hub to the host. FIG. 8 shows an embodiment of the structure of the error message. Here, in the first four bits of the header byte 801, the communication is identified as being an error message from an attempt to communicate to a component attached to a local bus (special code "1100"), and, the next three bits identify the selected hub that is sending the error message ("Host HID"). The first byte of the payload identifies the specific component on the local bus to whom the prior communication failed and the second byte of the payload includes an error code that is used to explain the details of the error more specifically.

Figure 9:
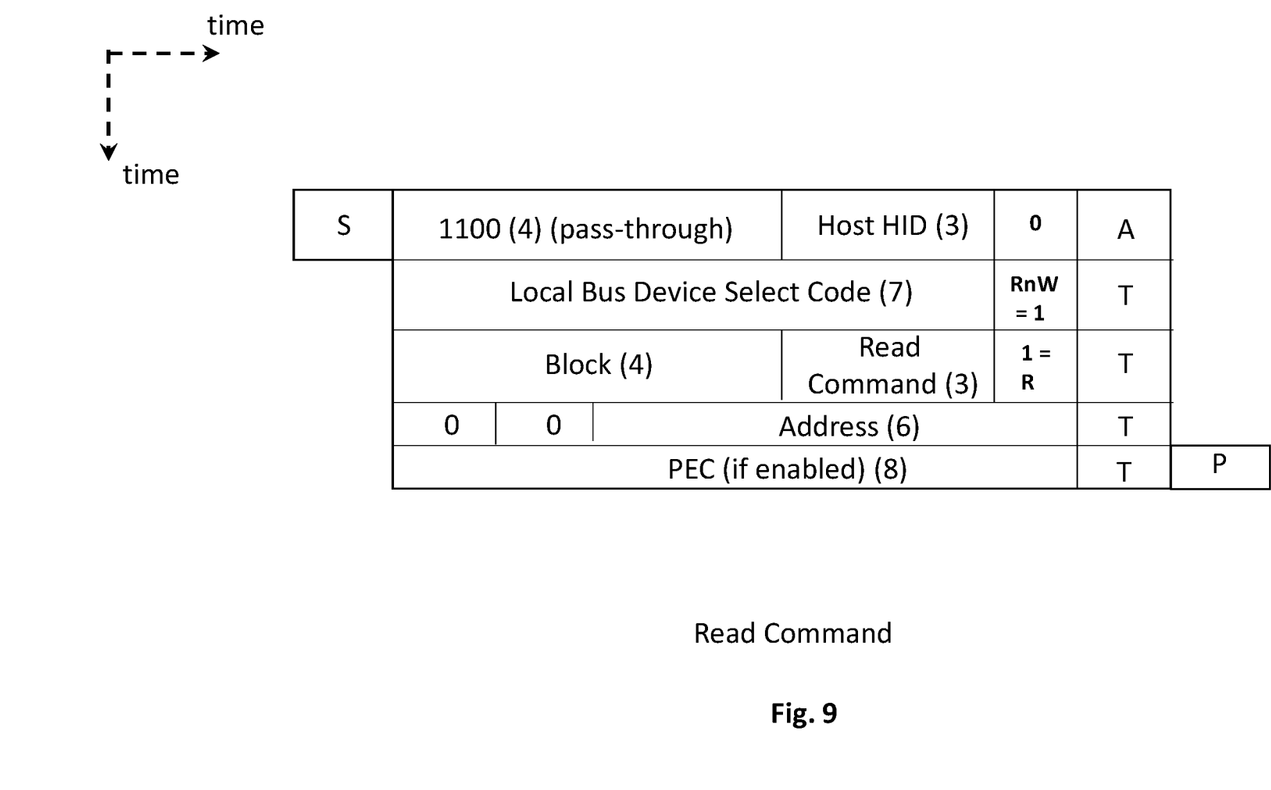
FIG. 9 shows an embodiment of a read command.

FIG. 9 shows an embodiment of a read command that is sent from the host to the selected hub. Here, the format/structure is the same as the write command of FIG. 7 except that no write data is included in the payload.

Figure 10:
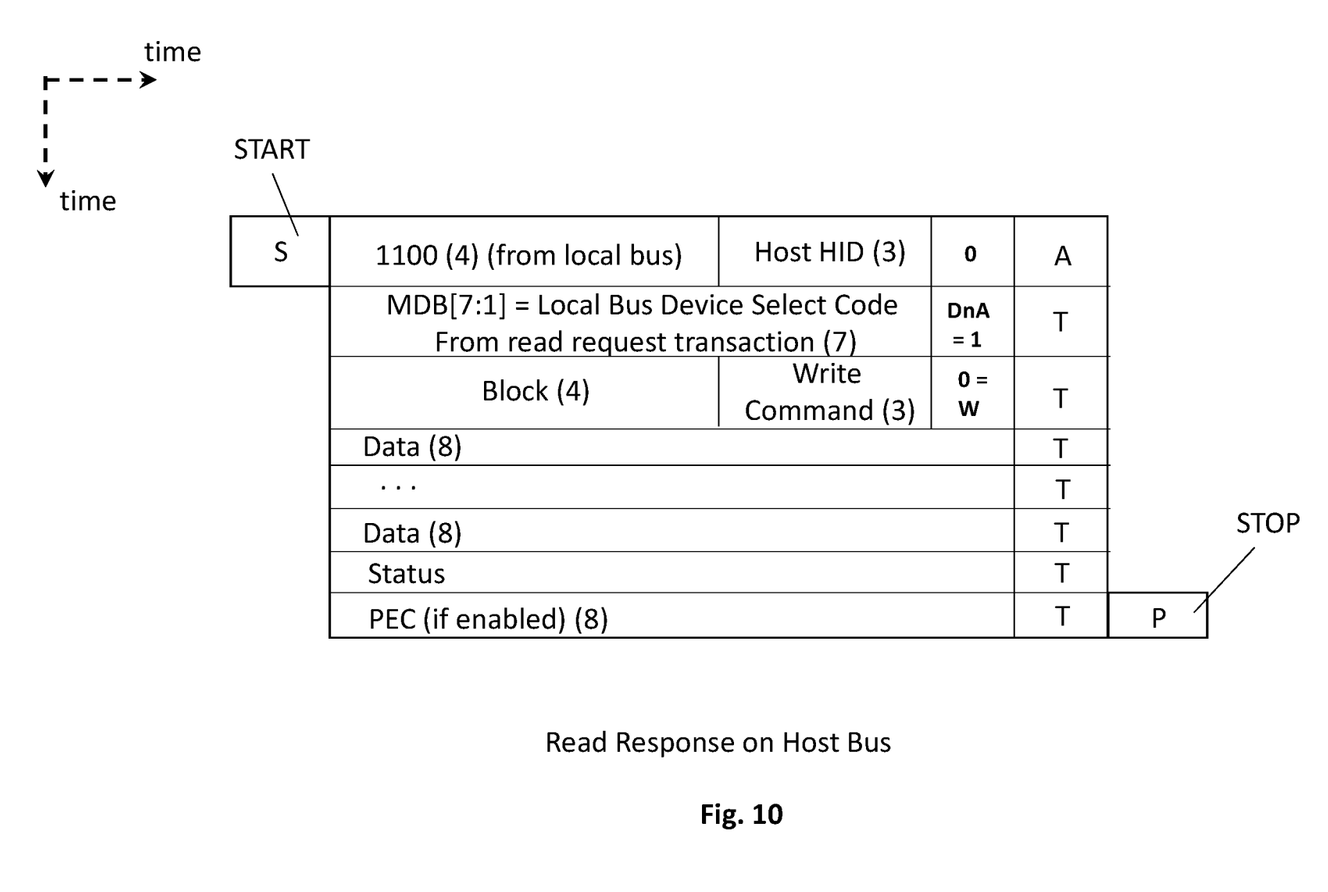
FIG. 10 shows an embodiment of a read response.

FIG. 10 shows an embodiment of the read response that is sent back to the host in response to the read command of FIG. 9. Here, the structure is the same as the error message of FIG. 8 except that the payload includes the read data ("Data").

In the embodiments descried above, special code "1100" is used in the first four bits of the header byte to specify a communication to/from a component that is coupled to the local bus other than a hub device. In further embodiments, the special code "1010" is used to specify communications to/from a hub device. In the case of the later, the initial bits of the first byte of the payload that are nominally used to identify a component on a local bus are not used (N/A).

Figure 11:
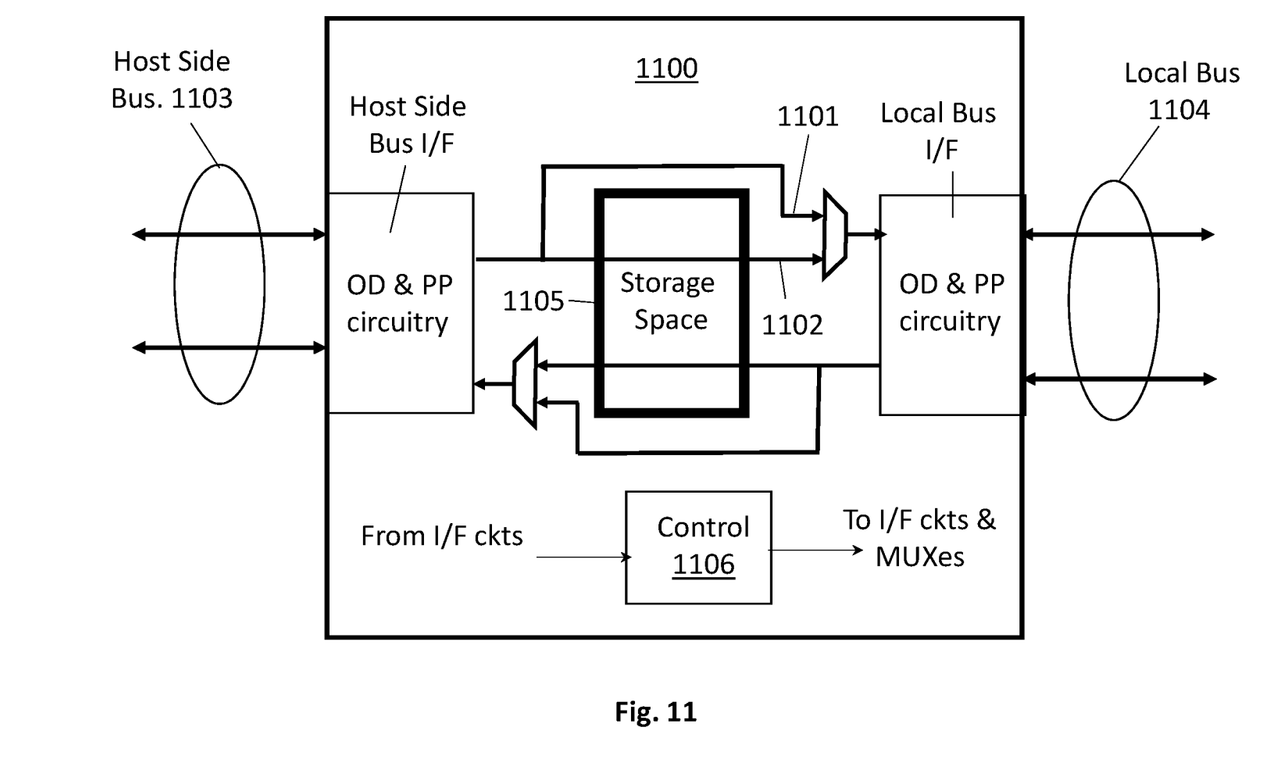
FIG. 11 shows a hub circuit.

FIG. 11 shows an embodiment of hub circuitry 1100 for implementing a hub as described above. Notably the hub circuity 1100 includes two paths 1101, 1102 from the host side bus 1103 to the local bus 1104. As described above, both the host side bus 1103 and local bus 1104 are, in various embodiments, a MIPI I3C bus which, as is known in the art, can be implemented with only two physical wires (e.g., an SDA wire and an SCL wire).

A first of the paths 1101 does not flow through the storage space 1105 and therefore corresponds to the path of the short-circuit mode of FIG. 6a. A second path 1102 flows through the storage space 1105 and therefore corresponds to the store and forward approach of FIG. 6b. Likewise, an analogous pair of paths exist in the local bus 1104 to host side bus 1103 direction. Here, for example, a store and forward approach may be used by the hub in the case of a read response being sent to the hub on the local bus 1104 while the host side bus 1103 is busy. Control logic circuitry 1106 is used to control the overall operation of the hub circuitry 1100 consistent with the teachings above. Here, the control logic circuitry 1106 maintains state awareness of both the host side and local busses 1103, 1104 and determines whether short circuit mode or store and forward mode is appropriate for any communication through the hub 1100. Channel selects of outbound multiplexers are set by the control logic circuitry 1106 to effect a particular type of path in either direction.

The control circuitry 1106 may also strip off the first header byte 701 and ensure that only payload 702 is forwarded when communications are flowing through the hub 1100. The control circuitry 1106 may also process the parity bit (T) of any incoming bytes and include protocol circuitry to send and/or receive any acknowledgements on either of the busses 1103, 1104. Note that the term "short circuit" mode and the like refers to at least to a logical short circuit and not necessarily a true electrical short circuit (e.g., the local bus interface circuitry re-drives the information received from the host side bus circuitry).

The control logic circuitry may be implemented with dedicated custom hardwired logic circuitry (e.g., custom state machine logic circuitry), programmable logic circuitry (e.g., field programmable gate array (FPGA), programmable logic array (PLA), programmable logic device (PLD), etc.) or logic circuitry that can execute some form of program code (e.g., an embedded processor, embedded controller, etc.) or any combination thereof. The storage space may be implemented with registers, embedded memory (e.g., embedded DRAM, embedded SRAM) and/or external memory. The overall hub circuitry may be integrated into a serial presence detect (SPD) semiconductor chip that is disposed on a DIMM.

The host side circuitry that acts as a bus master for the overall MIPI bus with hub architecture may be integrated on a processor having multiple general purpose processing cores and a main memory controller. Such host side circuitry may include interface circuitry similar to the interface circuitry of FIG. 11 to interface to the host side bus. Such host side circuitry may also include control circuitry that sends commands as described above at length to a hub circuit. The control circuitry may be composed of hardwired custom logic circuitry, programmable logic circuitry, logic circuitry that executes program code or any combination thereof. The control circuitry may be designed to deem that a communication directed to a targeted component on a local bus is complete upon the communication being received by a hub circuit (the control circuitry understands the hub circuit will forward the communication so that the host side does not have to send it).

Figure 12:
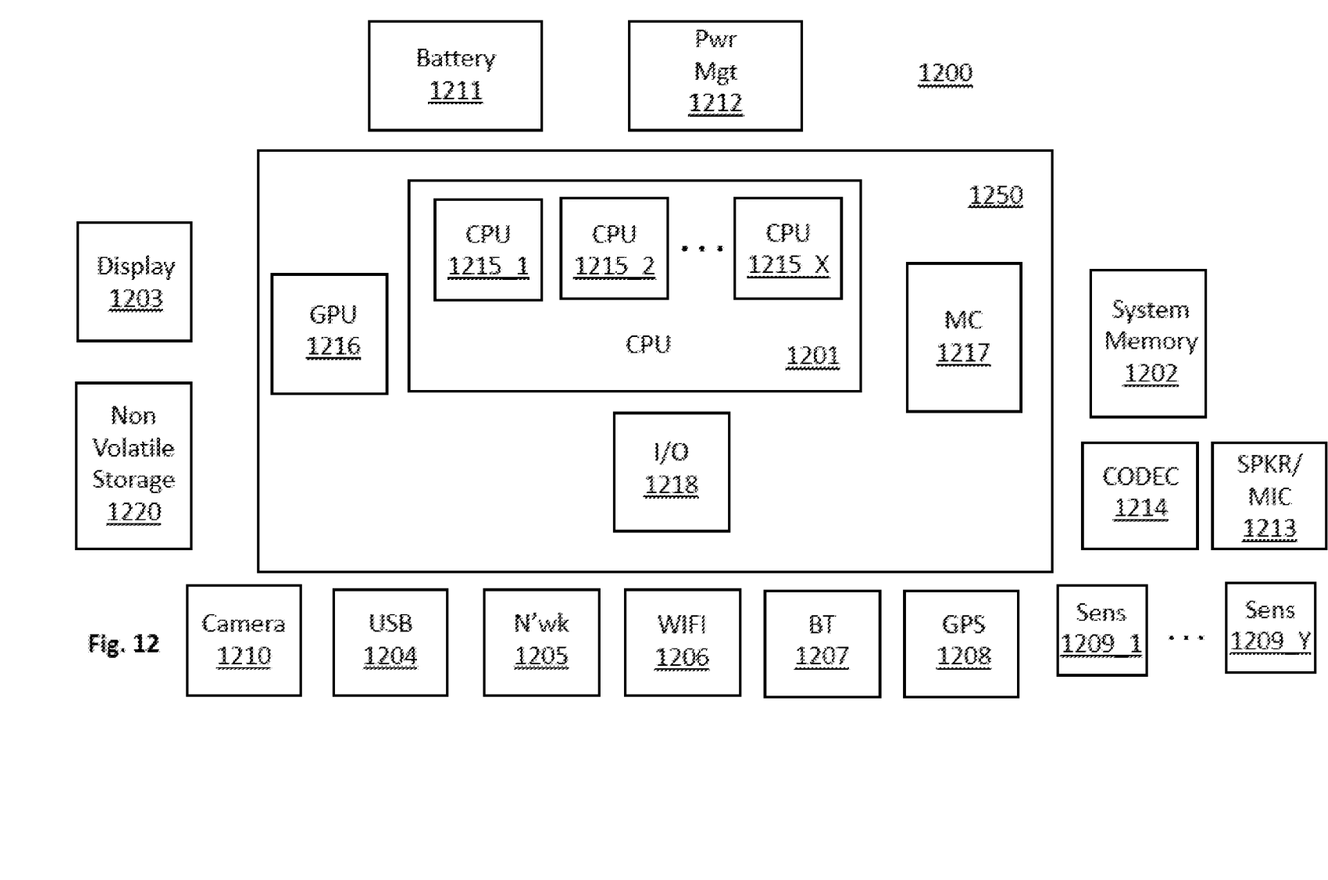
FIG. 12 shows a computer system.

FIG. 12 provides an exemplary depiction of a computing system 1200 (e.g., a smartphone, a tablet computer, a laptop computer, a desktop computer, a server computer, etc.). As observed in FIG. 12, the basic computing system 1200 may include a central processing unit 1201 (which may include, e.g., a plurality of general purpose processing cores 1215_1 through 1215_X) and a main memory controller 1217 disposed on a multi-core processor or applications processor, system memory 1202, a display 1203 (e.g., touchscreen, flat-panel), a local wired point-to-point link (e.g., USB) interface 1204, various network I/O functions 1205 (such as an Ethernet interface and/or cellular modem subsystem), a wireless local area network (e.g., WiFi) interface 1206, a wireless point-to-point link (e.g., Bluetooth) interface 1207 and a Global Positioning System interface 1208, various sensors 1209_1 through 1209_Y, one or more cameras 1210, a battery 1211, a power management control unit 1212, a speaker and microphone 1213 and an audio coder/decoder 1214.

An applications processor or multi-core processor 1250 may include one or more general purpose processing cores 1215 within its CPU 1201, one or more graphical processing units 1216, a memory management function 1217 (e.g., a memory controller) and an I/O control function 1218. The general purpose processing cores 1215 typically execute the operating system and application software of the computing system which may include micro-service software programs as described above. Even lower levels of software may be executed by the processing cores such as, e.g., a virtual machine monitor.

The graphics processing unit 1216 typically executes graphics intensive functions to, e.g., generate graphics information that is presented on the display 1203. The memory control function 1217 (e.g., a system memory controller) interfaces with the system memory 1202 to write/read data to/from system memory 1202. The interconnect between the system memory controller 1217 and the system memory 1202 may include, e.g., one or more DDR memory channels having DIMMs plugged into them. The memory channels may further include MIPI I3C busses (or compatible versions thereof) having hub architectures as described above at length. The power management control unit 1212 generally controls the power consumption of the system 1200.

Each of the touchscreen display 1203, the communication interfaces 1204-1207, the GPS interface 1208, the sensors 1209, the camera(s) 1210, and the speaker/microphone codec 1213, 1214 all can be viewed as various forms of I/O (input and/or output) relative to the overall computing system including, where appropriate, an integrated peripheral device as well (e.g., the one or more cameras 1210). Depending on implementation, various ones of these I/O components may be integrated on the applications processor/multi-core processor 1250 or may be located off the die or outside the package of the applications processor/multi-core processor 1250.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a DIMM hub circuit comprising:
first bus interface circuitry to couple to a first bus to receive header information and payload information from a host;
control circuitry to process the header information and recognize that the payload information is to be passed to a target component on a same DIMM that the DIMM hub circuit is on and that is coupled to the DIMM hub circuit through a second bus that is a same type of bus as the first bus; and,
second bus interface circuitry to send the payload information over the second bus to the target component, wherein, the payload information is to include embedded header information to be processed by the target component, wherein, data and address information for memory read and memory write operations directed to memory chips on the same DIMM that the DIMM hub circuit is on are presented on busses other than the first and second busses and not on either of the first and second busses.

2. The apparatus of claim 1 wherein the DIMM hub circuit is integrated within a DIMM serial presence detect circuit (SPD).

3. The apparatus of claim 1 wherein the DIMM hub circuit is on a DIMM.

4. The apparatus of claim 1 wherein the first and second busses are MIPI I3C busses.

5. The apparatus of claim 4 wherein the DIMM hub circuit is on a DIMM that is to couple to a DDR memory channel.

6. The apparatus of claim 1 wherein, if the payload information is for a write request directed to the target component, the payload information also includes the write request's write data.

7. The apparatus of claim 1 wherein, if the payload information includes a read request, the DIMM hub circuit is to receive read information requested by the read request from the second bus and resend it on the first bus.

8. The apparatus of claim 1 wherein the DIMM hub circuit further comprises storage circuitry to store and forward the payload information.

9. The apparatus of claim 1 wherein the DIMM hub circuit is to cause the payload information to be directly redriven on the second bus immediately after being received from the first bus.

10. An apparatus, comprising:
a processor semiconductor chip comprising host side circuitry to interface to a first bus that is to be coupled to a hub circuit on a DIMM that is to be coupled to the processor semiconductor chip by way of a memory channel, the hub circuit to forward a communication sent from a host side to a target component on a second bus that is coupled to the hub circuit, the target component on the DIMM, the first and second busses being a same type of bus, the host side circuitry to deem the communication to the target component complete upon reception of the communication by the hub circuit, wherein, data and address information for memory read and memory write operations directed to memory chips on the DIMM are presented on busses of the memory channel other than the first and second busses and not on either of the first and second busses.

11. The apparatus of claim 10 wherein the first and second busses are MIPI I3C busses.

12. The apparatus of claim 10 wherein the memory channel is a DDR memory channel.

13. The apparatus of claim 10 wherein the communication is formatted to include first header information that identifies the hub circuit and payload information that contains second header information that is to be processed by the target component.

14. The apparatus of claim 13 wherein, if the communication is a write request for the target component, the payload information also includes the write request's write data.

15. The apparatus of claim 13 wherein, if the communication is a read request for the target component, the host side circuitry is to receive read information requested by the read request from the hub circuit from the first bus.

16. A computing system, comprising:
a plurality of processing cores;
a system memory controller coupled to a system memory, the system memory comprising a DIMM, the DIMM comprising a DIMM hub circuit, comprising:
first bus interface circuitry to couple to a first bus to receive header information and payload information from a host;
control circuitry to process the header information and recognize that the payload information is to be passed to a target component that is on the DIMM and that is coupled to the DIMM hub circuit through a second bus that is a same type of bus as the first bus; and,
second bus interface circuitry to send the payload information over the second bus to the target component, wherein, the payload information is to include embedded header information to be processed by the target component, wherein, data and address information for memory read and memory write operations directed to memory chips on the DIMM are presented on busses other than the first and second busses and not on either of the first and second busses.

17. The computing system of claim 16 wherein, if the payload information is for a write request directed to the target component, the payload information also includes the write request's write data.

18. The computing system of claim 16 wherein, if the payload information includes a read request, the hub circuit is to receive read information requested by the read request from the second bus and resend it on the first bus.

19. The computing system of claim 16 wherein the hub circuit further comprises storage circuitry to store and forward the payload information.

20. The computing system of claim 16 wherein the DIMM hub circuit is to cause the payload information to be directly redriven on the second bus immediately after being received from the first bus.

* * * * *